United States Patent
Yamada

(10) Patent No.: US 11,940,735 B2
(45) Date of Patent: Mar. 26, 2024

(54) DEVELOPER COMPOSITION FOR FLEXOGRAPHIC PRINTING PLATE, DEVELOPER, AND METHOD OF MANUFACTURING PRINTING ORIGINAL PLATE

(71) Applicant: TOYOBO CO., LTD., Osaka (JP)

(72) Inventor: Hiroto Yamada, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 15 days.

(21) Appl. No.: 17/427,142

(22) PCT Filed: Mar. 27, 2020

(86) PCT No.: PCT/JP2020/013962
§ 371 (c)(1),
(2) Date: Jul. 30, 2021

(87) PCT Pub. No.: WO2020/196820
PCT Pub. Date: Oct. 1, 2020

(65) Prior Publication Data
US 2022/0100095 A1 Mar. 31, 2022

(30) Foreign Application Priority Data
Mar. 28, 2019 (JP) .................................. 2019-063700

(51) Int. Cl.
*G03F 7/32* (2006.01)
*B41C 1/10* (2006.01)

(52) U.S. Cl.
CPC ............ *G03F 7/322* (2013.01); *B41C 1/1016* (2013.01)

(58) Field of Classification Search
CPC ........................................................ G03F 7/32
See application file for complete search history.

(56) References Cited

U.S. PATENT DOCUMENTS

| 2013/0288185 A1* | 10/2013 | Yawata | G03F 7/322 |
| | | | 430/436 |
| 2018/0134030 A1 | 5/2018 | Ali et al. | |
| 2022/0107563 A1* | 4/2022 | Kita | G03F 7/322 |

FOREIGN PATENT DOCUMENTS

| EP | 2677365 A1 | 12/2013 |
| JP | 6-258847 A | 9/1994 |

(Continued)

OTHER PUBLICATIONS

International Search Report dated Jun. 16, 2020, issued in counterpart International Application No. PCT/JP2020/013962. (2 pages).

(Continued)

*Primary Examiner* — Chanceity N Robinson
(74) *Attorney, Agent, or Firm* — WHDA, LLP

(57) ABSTRACT

A developer composition for a water-developable photosensitive flexographic printing original plate is disclosed, containing (a) a nonionic surfactant composed of monoalkyl ether and/or monoalkyl ester of polyethylene glycol, wherein a number of carbon atoms of the alkyl group therein is 8 to 19, and wherein an HLB value thereof is 11 to 16; and (b) one or more anionic surfactants selected from the group consisting of oleic acid metal salt, lauric acid metal salt, dodecylbenzene sulfonic acid metal salt and lauryl sulfate metal salt, wherein a content ratio of (a):(b) is 25:75 to 75:25 (mass ratio), and wherein a brushing friction coefficient on a surface of a printing original plate is 0.60 to 0.75[–], when measured in an aqueous developer containing 1% by mass of the developer composition and 99% by mass of water.

4 Claims, 1 Drawing Sheet

(56) References Cited

FOREIGN PATENT DOCUMENTS

| | | | |
|---|---|---|---|
| JP | 06258847 A | * | 9/1994 |
| JP | H06-258847 A | * | 9/1994 |
| JP | 2000-282085 A | | 10/2000 |
| JP | 2000282085 A | * | 10/2000 |
| JP | 2001-341457 A | | 12/2001 |
| JP | 3266357 B2 | * | 3/2002 |
| JP | 2003-287906 A | | 10/2003 |
| JP | 2004-264649 A | | 9/2004 |
| JP | 2004-317660 A | | 11/2004 |
| WO | 2012/111238 A1 | | 8/2012 |

OTHER PUBLICATIONS

Notification of Transmittal of Translation of the International Preliminary Report on Patentability (Form PCT/IB/338) issued in counterpart International Application No. PCT/JP2020/013962 dated Oct. 7, 2021 with Forms PCT/IB/373 and PCT/ISA/237. (8 pages).
Extended (Supplementary)European Search Report dated Mar. 20, 2023, issued in counterpart EP Application No. 20778371.3. (7 pages).

* cited by examiner

[Fig. 1]
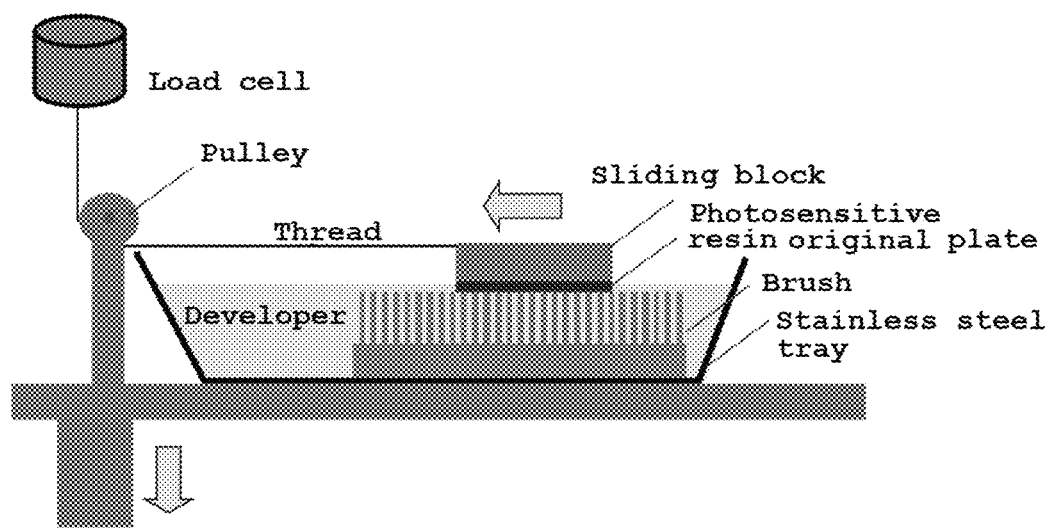
[Fig. 2]
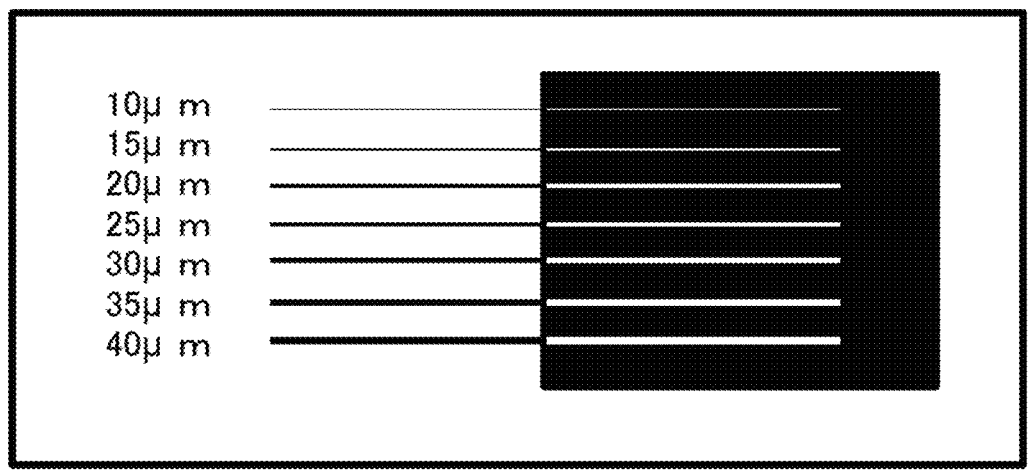

DEVELOPER COMPOSITION FOR FLEXOGRAPHIC PRINTING PLATE, DEVELOPER, AND METHOD OF MANUFACTURING PRINTING ORIGINAL PLATE

TECHNICAL FIELD OF THE INVENTION

The present invention relates to an aqueous developer used for water-developable photosensitive resin printing plate, and particularly to an aqueous developer suitable for CTP flexographic printing original plate having an infrared-sensitive layer that contains carbon black, and negative flexographic printing original plate.

BACKGROUND ART

A photosensitive resin plate, which has a support and provided thereon a photosensitive resin layer formed of a photosensitive resin composition, has been widely used as a printing plate, and has become a mainstream in various fields including resin relief printing, planographic printing, intaglio printing and flexographic printing. A photosensitive resin composition used for these printing plates is strongly required to be developable with an aqueous developer, in consideration of environmental impact and workability. The water-developable photosensitive resin compositions having been available from the market include a product composed of a synthetic rubber, a hydrophilic polymer and a cross-linking agent.

For manufacture of these printing plates, having been widely applied is a method (negative method) by which an original pattern film is placed under vacuum in close contact with a photosensitive resin printing original plate, and the printing original plate is irradiated with active light through the original pattern film. According to the negative method, an exposed region which was irradiated with the active light selectively causes a photocrosslinking reaction, thereby forming a pattern-forming part. An un-photocrosslinked resin composition in a non-exposed region is then rinsed off with an aqueous developer, whereby a patterned relief is obtained.

This sort of negative printing plate needs the original pattern film, and consequently needs time and cost for manufacturing the original pattern film. Moreover, development of the original pattern film needs a chemical process, and also needs disposal of waste developer which is disadvantageous from the viewpoint of environmental hygiene.

Recent advancement of computer has led to a proposal of a method (Computer to Plate, CTP method) by which information processed on a computer is directly output to the photosensitive resin printing original plate so as to obtain a printing plate, without needing manufacture of the original pattern film. According to the CTP method, an infrared-sensitive layer which is not transparent to an active light is arranged on the printing original plate, and the infrared-sensitive layer is partially ablated with an infrared laser light, thereby forming a pattern mask. The printing original plate is then irradiated with an active light in the same way as in the negative method so as to form the pattern-forming part, and the unexposed part (un-photocrosslinked photosensitive resin) is rinsed off with an aqueous developer so as to obtain the patterned relief. The CTP method is advantageous not only because the aforementioned manufacturing process of the original pattern film is no longer necessary, making it no longer necessary to dispose the waste developer which is desirable in view of environmental hygiene, but also because the obtainable relief will have a sharp structure. Accordingly, the CTP method is a mainstream at the present.

The aqueous developer used for such water-developable photosensitive resin printing original plate is required to be developable within a short time, and to reproduce fine picture when considering reproducibility of printing. The pattern mask layer, and the un-photocrosslinked photosensitive resin composition in the photosensitive resin layer will be dissolved or dispersed in the developer. Repetitive development in the same aqueous developer would degrade developability, because the un-photocrosslinked resin and pattern mask layer (scum) dispersed in the developer would adhere on a brush. Also, the repetitive development in the same aqueous developer would degrade plate quality, because the scum would re-adhere on the surface of the printing plate. Various proposals have been made to address these issues.

Patent Document 1 proposes an aqueous developer blended with a nonionic surfactant. The developer is intended to enhance dispersibility of the uncrosslinked photosensitive resin composition, by combining a polyalkylene glycol monoalkyl ether with a polyalkylene glycol dialkyl ether. However, the developer has failed in thoroughly dispersing carbon black and a hydrophobic polymer having been used for the pattern mask layer in the CTP method, because the dispersibility of the pattern mask layer is left unconsidered in Patent Document 1. Also development speed in manufacture of the printing plate has been insufficient.

Patent Document 2 proposes a countermeasure for improving the poor dispersibility of the pattern mask layer. Patent Document 2 improves the dispersibility of water-insoluble components such as carbon black and a binder polymer, by adding an alkali metal salt of a saturated fatty acid combined with an alkali metal salt of an unsaturated fatty acid, to the aqueous developer. The aqueous developer, with the alkali metal salts of the fatty acids contained therein, might be a good aqueous dispersant for the pattern mask layer and the un-photocrosslinked photosensitive resin composition of the photosensitive resin layer, but suffers from slowing down of development speed, thus having failed in balancing the dispersibility of the pattern mask layer and the development speed of the photosensitive resin layer.

Regarding improvement of the development speed, Patent Document 3 makes a proposal for improving the development speed of the developer of Patent Document 1. A developer of Patent Document 3 adds an inorganic salt as a pH adjustor, and a hydrocarbon or higher alcohol ether as a rinsing accelerator to a polyalkylene glycol dialkyl ether, expecting the development accelerator to speed up the development. The developer can, however, swell not only the un-crosslinked resin in the photosensitive resin layer, but also the photocrosslinked photosensitive resin, that is, the resin in the pattern-forming part which serves as the printing plate. This has undesirably degraded reproducibility of a fine relief pattern such as thin line, isolated dot or halftone dot.

On the other hand, the diameter of a brush for a development apparatus has been becoming selectable within the range from 120 μm to 250 μm, depending on a picture to be printed. The developer is required to avoid slowing down of the development speed, particularly even when using a small diameter brush.

There has therefore been a strong need for a developer capable of achieving high levels of development speed of the photosensitive resin layer, diespersibility of the un-photocrosslinked resin composition in the photosensitive resin layer, dispersibility of the pattern mask layer, and fine pattern reproducibility of the obtainable printing plate, which are intrinsic issues, and also capable of achieving high development speed even with a thin brush, comparable to the development speed attainable by a thick brush. A highly advanced developer for photosensitive flexographic printing original plate, which satisfies all issues, has however not been proposed until today.

PRIOR ART DOCUMENTS

Patent Documents

Patent Document 1: Japanese Patent Application Laid-Open (JP-A) No. 2003-287906
Patent Document 2: WO2012/111238
Patent Document 3: Japanese Patent Application Laid-Open (JP-A) No. 2004-317660

DISCLOSURE OF THE INVENTION

Problem that the Invention is to Solve

The present invention was arrived at in consideration of the aforementioned situation of the prior art, a goal of which is to provide a developer composition used for preparing a developer for a water-developable photosensitive flexographic printing original plate, capable of satisfying high development speed even with a thin brush, which could not have been achieved before, and satisfying high levels of diespersibility of the un-photocrosslinked resin composition in the photosensitive resin layer, dispersibility of the pattern mask layer, and the pattern reproducibility, all of which have been issues from the past, as well as to provide a developer, and a method for manufacturing a printing plate.

Means for Solving the Problem

Aiming at achieving the goal, the present inventors conducted thorough examinations into a suitable chemical composition of the developer composition, and found that use of a specific nonionic surfactant (a) enables high development speed, also found that further combination with a specific anionic surfactant (b) for use in the composition enables high dispersibility of the pattern mask layer without degrading the high development speed, and also found that this satisfies high levels of pattern reproducibility, and dispersibility of the un-photocrosslinked photosensitive resin in the photosensitive resin layer. This laid us to complete the present invention.

Thus, the present invention has the constitutions of the following (1) to (5).

(1) A developer composition for a water-developable photosensitive flexographic printing original plate, containing (a) a nonionic surfactant composed of monoalkyl ether and/or monoalkyl ester of polyethylene glycol, wherein a number of carbon atoms of the alkyl group therein is 8 to 19, and wherein an HLB value thereof is 11 to 16; and (b) one or more anionic surfactants selected from the group consisting of oleic acid metal salt, lauric acid metal salt, dodecylbenzene sulfonic acid metal salt and lauryl sulfate metal salt, wherein a content ratio of (a):(b) is 25:75 to 75:25 (mass ratio), and wherein a brushing friction coefficient on a surface of a printing original plate is 0.60 to 0.75[–], when measured in an aqueous developer containing 1% by mass of the developer composition and 99% by mass of water.

(2) The developer composition according to (1), wherein the (a) nonionic surfactant is one or more compounds selected from the group consisting of polyoxyethylene 2-ethylhexyl ether, polyoxyethylene isodecyl ether, polyoxyethylene lauryl ether, polyoxyethylene cetyl ether, polyoxyethylene stearyl ether, polyethylene glycol monocaprylate, polyethylene glycol monocaprate, polyethylene glycol monolaurate, polyethylene glycol monomyristate, polyethylene glycol monostearate, polyethylene glycol monooleate and polyoxyethylene monostearate.

(3) An aqueous developer that contains 0.1 to 10% by mass of the developer composition according to (1) or (2), and 90 to 99.9% by mass of water.

(4) A method for manufacturing a flexographic printing plate, comprising a step of developing a CTP flexographic printing original plate with use of the aqueous developer according to (3), wherein the CTP flexographic printing original plate has at least (A) a support, (B) a photosensitive resin layer, (C) a protective layer, and (D) an infrared-sensitive layer that contains carbon black, which are stacked in this order.

(5) A method for manufacturing a flexographic printing plate, comprising a step of developing a flexographic printing original plate with use of the aqueous developer according to (3), wherein the flexographic printing original plate has at least (A) a support, (B) a photosensitive resin layer, and (E) an anti-sticking layer, which are stacked in this order.

Advantages of the Invention

The developer composition of the present invention, and the developer prepared by using the same, can avoid slowing down of the development speed even with use of a thin brush, thereby shortening a plate-manufacturing time, and enhancing productivity of a printing plate. In addition, high levels of dispersibility of the un-photocrosslinked resin component and the pattern mask layer into the developer can avoid re-adhesion of the resin component and so forth, thereby achieving high pattern reproducibility. Hence, the present invention can provide an advanced developer for a photosensitive flexographic printing original plate.

BRIEF DESCRIPTION OF THE DRAWINGS

FIG. 1 is a schematic structural drawing for explaining a method for measuring brushing friction coefficient specified by the present invention.

FIG. 2 is a drawing illustrating a graphic pattern used for evaluating pattern reproducibility.

BEST MODE FOR CARRYING OUT THE INVENTION

The developer composition of the present invention is used for preparing an aqueous developer for a water-developable photosensitive flexographic printing original plate, and is characterized by containing, as surfactants, a specific nonionic surfactant (a) and a specific anionic surfactant (b) in a specific mass ratio. In the developer composition of the present invention, use of the specific nonionic surfactant (a) enables high development speed. In addition, the further combination with the specific anionic surfactant (b) for use in the composition enables high dispersibility of the pattern mask layer without degrading the high development speed. Further, the developer composition of the present invention satisfies high levels of pattern reproducibility, and dispersibility of the un-photocrosslinked photosensitive resin in the photosensitive resin layer.

As to the (a) nonionic surfactant, monoalkyl ether and/or monoalkyl ester of polyethylene glycol wherein a number of carbon atoms of the alkyl group therein is 8 to 19, and wherein an HLB value thereof is 11 to 16 is/are used in view of cost and safety. Use of such specific nonionic surfactant can make the developer composition superior in all performances including development speed, pattern reproducibility, and dispersibility of un-crosslinked resin composition. Among others, polyethylene glycol monoalkyl ether is particularly preferred for its high hydrolysis resistance.

The polyethylene glycol monoalkyl ether and/or monoalkyl ester necessarily have an HLB (Hydrophile-Lipophile Balance) value of 11 to 16. The HLB value is preferably 12 to 15. The HLB value represents the degree of affinity of surfactant to water and oil. The HLB value is adjustable to a specific value, by increasing or decreasing the number of repeating units of polyethylene glycol (which is a hydrophilic component) and the number of carbon atoms of the alkyl group (which is a lipophilic component). With the HLB value smaller than the aforementioned range, the surfactant will be more likely to swell the un-crosslinked resin, so that a fine pattern will cause volumetric expansion and will become more likely to separate from the support. The pattern reproducibility will therefore degrade. With the HLB value exceeding the aforementioned range, brushing friction coefficient will decrease to weaken rubbing effect by the brush, thereby slowing down the development speed. The number of carbon atoms of the alkyl group in the polyethylene glycol monoalkyl ether and/or monoalkyl ester is necessarily 8 to 19. With the number of carbon atoms of the alkyl group being 7 or less, the surfactant will reduce its potency, will be more likely to swell the un-crosslinked resin, and will degrade all of dispersibility of the pattern mask layer, dispersibility of the un-crosslinked photosensitive resin component, and pattern reproducibility. With the number of carbon atoms of the alkyl group being 20 or more, the surfactant will be less likely to swell the un-crosslinked resin due to its large molecular weight, which is undesirable not only because the development speed is slowed down, but also because solubility to water is reduced.

Specific examples of the polyethylene glycol monoalkyl ether include polyoxyethylene alkyl ethers such as polyoxyethylene oleyl ether and polyoxyethylene lauryl ether; polyoxyethylene alkylphenyl ethers such as polyoxyethylene nonylphenyl ether and polyoxyethylene octylphenyl ether; and polyoxyethylene polyoxypropylene glycols. Among them, preferred are polyoxyethylene 2-ethylhexyl ether, polyoxyethylene isodecyl ether, polyoxyethylene lauryl ether, polyoxyethylene cetyl ether and polyoxyethylene stearyl ether.

Specific examples of the polyethylene glycol monoalkyl ester include monoalkyl esters formed between polyethylene glycol and fatty acid, such as polyethylene glycol monocaprylate, polyethylene glycol monocaprate, polyethylene glycol monolaurate, polyethylene glycol monomyristate, polyethylene glycol monostearate, polyethylene glycol monooleate and polyoxyethylene monostearate; and, esters formed between polyoxyethylene adduct of sorbitan and fatty acid, such as polyoxyethylene sorbitan monolaurate and polyoxyethylene sorbitan monostearate. Among them, preferred are polyethylene glycol monocaprylate, polyethylene glycol monocaprate, polyethylene glycol monolaurate, polyethylene glycol monomyristate, polyethylene glycol monostearate, polyethylene glycol monooleate and polyoxyethylene monostearate.

As to the (a) nonionic surfactant, although any of polyethylene glycol monoalkyl ether or polyethylene glycol monoalkyl ester may be used independently, polyethylene glycol monoalkyl ether and polyethylene glycol monoalkyl ester may be used in a combined manner. Each of the polyethylene glycol monoalkyl ether and the polyethylene glycol monoalkyl ester, when used independently, may have two or more types combined therein.

The polyethylene glycol monoalkyl ether usable here may be a commercially available product, or may be produced referring to known literatures such as Japanese Patent Application Laid-Open (JP-A) No. 158384/98. Meanwhile, the polyethylene glycol monoalkyl ester usable here may be a commercially available produce, or may be produced by a method by which long-chain monocarboxylic acid and alcohol are esterified.

The (b) anionic surfactant is blended for the purpose of enhancing dispersibility of the pattern mask layer. The (b) anionic surfactant needs to be oleic acid metal salt, lauric acid metal salt, dodecylbenzene sulfonic acid metal salt or lauryl sulfate metal salt. They are good dispersants particularly for the pattern mask layer, and, if combined with a nonionic surfactant, will not interfere with the performances such as development speed, pattern reproducibility, and dispersibility of the un-crosslinked resin composition.

The metal salt of the anionic surfactant may have any metal species without special limitation. Alkali metal salt and/or alkali earth metal salt are preferred. Sodium salt, potassium salt, lithium salt, magnesium salt and calcium salt are particularly preferred.

The developer composition of the present invention contains the specific (a) nonionic surfactant and the specific (b) anionic surfactants in a content ratio (a):(b) of 25:75 to 75:25 (mass ratio). This is for achieving both of the development speed and dispersibility of the pattern mask layer. The developer composition of the present invention may be optionally blended with other metal salts and organic salts; polymer additives such as carboxymethyl cellulose and methyl cellulose; acids such as sulfuric acid, hydrochloric acid and phosphoric acid, or alkali, for pH adjustment; and other various additives including viscosity modifier, dispersion stabilizer, defoaming agent, flocculant and zeolite.

Next, brushing friction coefficient will be explained. The brushing friction coefficient on the surface of the printing original plate, specified in the present invention, represents frictional force exhibited when a brush is slid over the surface of the photosensitive resin original plate in the aqueous developer. The present invention is characterized in that the brushing friction coefficient on the surface of the printing original plate is set to be 0.60 to 0.75[–], when measured in an aqueous developer containing 1% by mass of the developer composition of the present invention and 99% by mass of water. This enables the brush to optimally exhibit its rubbing effect, thereby satisfying high levels of development speed and pattern reproducibility. With the brushing friction coefficient fallen within the aforementioned range and kept in compliance with the aforementioned conditions, the developer composition will excellently achieve both of the pattern reproducibility and the development speed in high levels.

Method for adjusting the brushing friction coefficient in the present invention within the aforementioned range is exemplified by a method wherein polyethylene glycol monoalkyl ether and/or polyethylene glycol monoalkyl ester, having an HLB value of 16 or smaller, are used as the (a) nonionic surfactant, and the brushing friction coefficient is controlled by increasing or decreasing the content of the (a) nonionic surfactant. General tendency is that, the brushing friction coefficient declines as the content of the (a) nonionic surfactant decreases, and the brushing friction coefficient elevates as the content of the (a) nonionic surfactant increases. Also note that, among the (a) nonionic surfactants, those having larger HLB values tend to exhibit smaller brushing friction coefficients.

Next, the aqueous developer prepared by using the developer composition of the present invention will be explained. The aqueous developer of the present invention contains water as a major ingredient. Ratio of blending of the developer composition in the developer, although not specifically limited, is preferably 0.1 to 10% by mass for the developer composition, and 90 to 99.9% by mass for water, considering the amounts of blending widely applied.

The developer used in the present invention is an aqueous developer, in consideration of workers' safety and environmental impact. It is, however, permissible to optionally add a small amount of other water-soluble organic solvent such as ethanol, isopropanol, cellosolve, glycerin, polyethylene glycol, dimethylformamide, dimethylacetamide or acetone.

If the developer has the pH fallen below 3, any hydrophilic component will exhibit less affinity to the developer, thereby slowing down the development speed. A pH value of 4 or larger will suffice for the development, wherein a pH value of 6 or larger is preferred. Considering the workers' safety, the pH most preferably falls in the range from 6 to 10.

Next, the photosensitive flexographic printing original plate developed with use of the aqueous developer of the present invention will be explained. The aqueous developer of the present invention is applicable not only to the negative photosensitive flexographic printing original plate, but also to the CTP photosensitive flexographic printing original plate. The aqueous developer of the present invention is particularly effective when applied to the CTP photosensitive flexographic printing original plate.

Now, application to a water-developable photosensitive flexographic printing original plate will be explained below, as a specific example of the method of use of the aqueous developer that contains the developer composition of the present invention.

The water-developable photosensitive flexographic printing original plate generally has, in the CTP method, at least (A) a support, (B) a photosensitive resin layer, (C) a protective layer, and (D) an infrared-sensitive layer that contains carbon black which are stacked in this order; and, in the negative method, at least (A) a support, (B) a photosensitive resin layer, and (E) an anti-sticking layer which are stacked in this order.

The (A) support is preferably made from a material being flexible and having a superior dimension stability. Examples thereof include: a support made of metal, such as steel, aluminum, copper and nickel, and a support made of a thermoplastic resin, such as a polyethylene terephthalate film, a polyethylene naphthalate film, a polybutylene terephthalate film and a polycarbonate film. Among these, the polyethylene terephthalate film, which has the superior dimension stability and a sufficiently high viscoelasticity, is in particular preferably used. A thickness of the support is set to 50 to 350 μm, preferably, to 100 to 250 μm, from viewpoints of mechanical properties, shape stability and handling characteristics during manufacturing of a printing plate. Moreover, if necessary, an adhesive may be formed between them in order to improve an adhesive property between the support and the photosensitive resin layer.

The (B) photosensitive resin layer is composed of essential components which are synthetic polymer compound, photopolymerizable unsaturated compound and photopolymerization initiator, and an optional additive such as plasticizer, thermal polymerization preventer, dye, pigment, ultraviolet absorber, fragrance or antioxidant. In the present invention, the (B) photosensitive resin layer needs to be developable with the aqueous developer. Latex is preferably used as the water-developable synthetic polymer compound. Although the water-developable photosensitive resin layer is flexible in most cases, use of latex inevitably make the printing original plate very flexible. When latex is not used, synthetic polymer compounds described typically in Japanese Patent Application Laid-Open (JP-A) No. 198058/91 may be applicable, for example.

Examples of latex which can be used in the present invention include: water-dispersible latex polymers, such as polybutadiene latex, natural rubber latex, styrene-butadiene copolymer latex, acrylonitrile-butadiene copolymer latex, polychloroprene latex, polyisoprene latex, polyurethane latex, methylmethacrylate-butadiene copolymer latex, vinylpyridine polymer latex, butyl polymer latex, thiokol polymer latex and acrylate polymer latex; and polymers obtained by copolymerizing another component, such as acrylic acid and methacrylic acid, therewith. Among these, water-dispersible latex polymers having a butadiene skeleton or an isoprene skeleton in molecular chains are preferably used from viewpoints of hardness and rubber elasticity. More specifically, polybutadiene latex, styrene-butadiene copolymer latex, acrylonitrile-butadiene copolymer latex, methylmethacrylate-butadiene copolymer latex and polyisoprene latex are preferably used. It is necessary that the latex exists as independent fine particles.

The (C) protective layer is provided for preventing oxygen-induced inhibition of polymerization of the photosensitive resin layer. Material for constituting the (C) protective layer may not be limited as far as the (C) protective layer is removable with the aqueous developer, and the (C) protective layer may be formed by using either water-soluble or water-insoluble polymer. Although the water-insoluble polymer might be removable, and therefore be developable physically by brushing, the water-soluble polymer is preferred for shorter development time. Such polymer for constituting the (C) protective layer is exemplified by soluble polyamide, polyvinyl alcohol, polyacrylic acid, polyethylene oxide, alkyl cellulose, cellulosic polymer (particularly hydroxypropyl cellulose, hydroxyethyl cellulose and nitrocellulose), cellulose acetate butyrate, polybutyral, butyl rubber, NBR rubber, acrylic rubber, styrene-butadiene rubber, latex and soluble polyester. These polymers may be used not only singly, but also in a combined manner with use of two or more types. The (C) protective layer preferably has a thermal decomposition temperature higher than that of the (D) infrared-sensitive layer. This is because the protective layer, if having the thermal decomposition temperature lower than that of the infrared-sensitive layer, would be thermally decomposed together during ablation of the infrared-sensitive layer.

The (D) infrared-sensitive layer that contains carbon black is constituted by a binder, and a material that functions to absorb infrared laser light and convert it to heat, and to block ultraviolet radiation. Other freely-selectable components such as pigment dispersant, filler, surfactant or coating auxiliary may be contained within a range that does not damage the effects of the present invention.

The (D) infrared-sensitive layer preferably has an optical density of 2.0 or larger to actinic radiation. The optical density is more preferably 2.0-3.0, and especially preferably 2.2-2.5. The (D) infrared-sensitive layer preferably has a thickness of 0.5 to 5.0 μm, more preferably 1.0 to 2.0 μm. At or above the aforementioned lower limit, a certain level of optical density is obtainable without needing special skill of coating. On the other hand, at or below the upper limit, the infrared-sensitive layer will need not so high energy to be ablated, which is advantageous from the viewpoint of cost.

As to the binder, although not specifically limited, polar copolymerized polyamide is preferably applied. Applicable polyamide may be suitably selected from known cationic polyamide, nonionic polyamide and anionic polyamide, which is exemplified by tertiary amine group-containing polyamide, quaternary ammonium salt-containing polyamide, ether group-containing polyamide and sulfonic group-containing polyamide.

The material having the aforementioned functions of absorbing infrared radiation and of blocking ultraviolet radiation is exemplified by dyes such as phthalocyanine, substituted phthalocyanine derivative, cyanine, merocyanine dye, and polymethine dye; and pigments such as carbon black, graphite, chromium oxide and iron oxide. Among them, carbon black is particularly preferred, taking photoelectric conversion efficiency, economic efficiency and handleability into account.

The material having the aforementioned functions of absorbing infrared radiation and blocking ultraviolet radiation is properly used at a concentration where the optical density and the thickness are suitably achieved. The content thereof is usually 1 to 60% by mass, preferably 10 to 50% by mass, relative to the total mass of the (D) infrared-sensitive layer. With the concentration below the lower limit, the optical density will fall below 2.0, so that the material may not exhibit the infrared absorbing function and the ultraviolet blocking function. With the concentration above the upper limit, the film-forming property may degrade due to shortage of binder and other components.

The (D) infrared-sensitive layer preferably has a peerable flexible cover film arranged thereon, so as to protect the printing original plate. Preferred peerable flexible cover film is exemplified by polyethylene terephthalate film, polyethylene naphthalate film and polybutylene terephthalate film.

The (E) anti-sticking layer is provided for preventing the original pattern film from sticking to the photosensitive resin layer, when the original pattern film is placed under vacuum in close contact with the photosensitive resin printing original plate, and the printing original plate is irradiated with the active light through the original pattern film. The (E) anti-sticking layer may be formed by using either water-soluble or water-insoluble polymer. Although the water-insoluble polymer might be removable, and therefore be developable physically by brushing, the water-soluble polymer is preferred for shorter development time. Such polymer for constituting the (E) anti-sticking layer is exemplified by soluble polyamide, polyvinyl alcohol, polyacrylic acid, polyethylene oxide, alkyl cellulose, cellulosic polymer (particularly hydroxypropyl cellulose, hydroxyethyl cellulose and nitrocellulose), cellulose acetate butyrate, polybutyral, butyl rubber, NBR rubber, acrylic rubber, styrene-butadiene rubber, latex and soluble polyester. These polymers may be used not only singly, but also in a combined manner with use of two or more types. Also, various additives may be contained as optional components, depending on necessity.

The (E) anti-sticking layer preferably has a peerable flexible cover film arranged thereon, so as to protect the printing original plate. Preferred peerable flexible cover film is exemplified by polyethylene terephthalate film, polyethylene naphthalate film and polybutylene terephthalate film.

The printing original plate of the present invention may be produced, for example, as mentioned below in the CTP method.

Firstly, all components constituting the infrared-sensitive layer are dissolved in a suitable solvent so as to prepare a solution. Alternatively, when pigment such as carbon black is used, all components other than the pigment are dissolved in a suitable solvent, and then the pigment is dispersed therein so as to prepare a dispersion. Then the solution or dispersion as such is applied onto a support (such as a PET film) for the infrared-sensitive layer. Then the solvent is evaporated therefrom. After that, a component for the protective layer is applied thereon whereupon one laminate is prepared. Further, apart therefrom, the photosensitive resin layer is formed on another support by means of application whereupon another laminate is prepared. The two laminates prepared as such are layered under pressurization and/or heating in such a manner that the photosensitive resin layer adjacently contacts the protective layer. Incidentally, after completion of the printing original plate, the support for the infrared-sensitive layer functions as a protective film for a surface thereof.

Now, a method for producing a printing plate from this printing original plate will be explained. Firstly, the protective film is removed from the photosensitive printing original plate. Thereafter, the infrared-sensitive layer is imagewise-irradiated with an IR laser so that a pattern mask is formed on the photosensitive resin layer. Preferable examples of the IR laser include an ND/YAG laser (1064 nm) and a diode laser (for example, 830 nm). A laser system appropriate for the Computer to Plate Technique is commercially available, and, for example, diode laser system CDI Spark (manufactured by Esko-Graphics Co., Ltd.) may be used. This laser system includes a rotation cylinder drum used for holding a printing original plate, an IR laser irradiating device and a layout computer. Pattern information is directly transferred from the layout computer to the laser device.

After the pattern information has been written in the infrared-sensitive layer, the entire surface of the photosensitive printing original plate is irradiated with active light rays via the pattern mask. This process may be carried out with the plate attached to the laser cylinder; however, a method is generally used in which, after the plate has been removed from the laser device, the irradiation process is carried out by using a commonly-used irradiation unit having a flat plate shape because this method is more advantageous in that even a plate size out of the standard can be appropriately handled. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed with use of the developer of the present invention, so that the printing plate is obtained.

The printing original plate of the present invention may be produced, for example, as mentioned below in the negative method.

Firstly, the components constituting the anti-sticking layer are dissolved in a suitable solvent so as to prepare a solution. Then the solution as such is applied onto a support (such as a PET film). Then the solvent is evaporated therefrom whereupon one laminate is prepared. Further, apart therefrom, the photosensitive resin layer is formed on another support by means of application whereupon another laminate is prepared. The two laminates prepared as such are layered under pressurization and/or heating in such a manner that the photosensitive resin layer adjacently contacts the anti-sticking layer. Incidentally, after completion of the printing original plate, the support functions as a protective film for a surface thereof.

Now, a method for producing a printing plate from this printing original plate of the present invention will be explained. Firstly, the protective film is removed from the photosensitive printing original plate. Thereafter, a negative film having a pattern is placed under vacuum in close contact with the printing original plate, and the entire surface of the printing original plate is irradiated with active light rays. Examples of the active light rays include: ultraviolet rays having a wavelength in a range from 150 to 500 nm, in particular, from 300 to 400 nm. Examples of its light source include: a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed with use of the developer of the present invention so that the printing plate is obtained.

EXAMPLES

The present invention will now be illustrated in more detail by way of the following Examples although the present invention is not limited thereto.

<Preparation of Photosensitive Flexographic Printing Original Plate>

(1) Preparation of Photosensitive Resin Composition X

An acrylonitrile-butadiene latex (Nipol SX1503 containing 42% of nonvolatile matters; from Nippon Zeon) (10 parts by mass), 58 parts by mass of a butadiene latex (Nipol LX111NF containing 55% of nonvolatile matters; from Nippon Zeon), 28 parts by mass of oligobutadiene acrylate (ABU-2S from Kyoeisha Kagaku), 4 parts by mass of lauryl methacrylate (Light Ester L from Kyoeisha Kagaku), 4 parts by mass of dimethylol tricyclodecane diacrylate, 1 part by mass of a photopolymerization initiator, 0.1 part by mass of hydroquinone monomethyl ether as a polymerization inhibitor and 0.1 part by mass of a nonionic surfactant as an other additive were mixed in a container together with 15 parts by mass of toluene. Then, they were kneaded at 105° C. using a pressure kneader. After that, toluene and water were removed therefrom in vacuo to prepare the photosensitive resin composition X.

(2) Preparation of Coating Liquid for the Protective Layer

A low-saponification polyvinyl alcohol (PVA405 from Kuraray Co., Ltd.), a plasticizer (SANFLEX SE270 from Sanyo Chemical Industries, Ltd., aliphatic polyhydric alcohol-based polyether polyol, with 85% by mass solid concentration) and an NBR latex (SX1503A from Nippon Zeon, with 42% by mass solid concentration) were dissolved in a water/isopropanol mixed solution, while adjusting the mass ratio of solid content to 35/35/30, thereby preparing a coating liquid for the protective layer.

(3) Preparation of Coating Liquid for the Infrared-Sensitive Layer

A carbon black dispersion (AMBK-8 from Orient Chemical Industries, Co., Ltd.) and a copolymerized polyamide (PA223 from TOYOBO Co., Ltd.) were dissolved in a methanol/ethanol/isopropanol mixed solution while adjusting the mass ratio of solid content to 63/37, thereby preparing a coating liquid for the infrared-sensitive layer.

(4) Preparation of Multilayered Film Y

The coating liquid for the infrared-sensitive layer was coated on a 100 μm thick PET film having both surfaces release-treated, with use of a suitable type of bar coater, and the coating was dried at 120° C. for 5 minutes, thereby overlaying a 1.5 μm thick infrared-sensitive layer on the PET film. The optical density at this time was found to be 2.3. The optical density was measured with use of a black-and-white transmission densitometer DM-520 (from Dainippon Screen Mfg. Co., Ltd.).

Next, the coating liquid for the protective layer was coated on the infrared-sensitive layer with use of a suitable type of bar coater, and the coating was dried at 120° C. for 5 minutes, thereby forming a multilayered film Y having the 1.5 μm thick infrared-sensitive layer and a 0.5 μm thick protective layer stacked in this order on the PET film.

(5) Preparation of Photosensitive Flexographic Printing Original Plate Composed of Photosensitive Resin Layer X and Multilayered Film Y The photosensitive resin composition X was placed on a 100 μm thick PET film having a copolymerized polyester-based adhesive coated thereon, and the multilayered film Y was further overlaid thereon. The stack was laminated at 100° C. with use of a heat press machine, thereby obtaining a photosensitive flexographic printing original plate composed of the PET support, the adhesive layer, the photosensitive resin layer, the protective layer, the infrared-sensitive layer and the release-treated PET protective film (cover film), having a total thickness of 1.2 mm.

Examples 1 to 16 and Comparative Examples 1 to 10

<Preparation of Aqueous Developer>

Components of each developer composition summarized in Table 1 were weighed so that the total accounts for 1% by mass of the developer, and each developer composition was dissolved in tap water, to prepare aqueous developers of Examples 1 to 16 and Comparative Examples 1 to 10. More specifically, each developer composition was added by a small amount into tap water contained in a container, and dissolved under stirring.

Details of the individual compounds summarized in Table 1 are as follows.

(a) Nonionic Surfactant

Polyethylene glycol monohexylate [polyethylene glycol (n=5) monohexyl (the number of carbon atoms=6) ester, a liquid obtained by esterifying 50 g of BLAUNON PEG200 (from AOKI OIL INDUSTRIAL Co., Ltd.) and 33.5 g of hexanoyl chloride (from Tokyo Chemical Industry Co., Ltd.) in 1 L of THF for one hour, and remained after vaporizing THF]

Polyoxyethylene 2-ethylhexyl ether (BLAUNON EH-6 (from AOKI OIL INDUSTRIAL Co., Ltd.), 6-mole ethylene oxide adduct of chain-like primary alcohol, with the number of carbon atoms of 8)

Polyoxyethylene decyl ether (Finesurf D-85 (from AOKI OIL INDUSTRIAL Co., Ltd.), 8.5-mole ethylene oxide adduct of straight-chain secondary alcohol, with the number of carbon atoms of 10)

Polyoxyethylene lauryl ether (EMULGEN 106 (from KAO Corporation), 4-mole ethylene oxide adduct of straight-chain primary alcohol, with the number of carbon atoms of 12)

Polyoxyethylene lauryl ether (EMULGEN 108 (from KAO Corporation), 6-mole ethylene oxide adduct of straight-chain primary alcohol, with the number of carbon atoms of 12)

Polyoxyethylene lauryl ether (BLAUNON EL-1509 (from AOKI OIL INDUSTRIAL Co., Ltd.), 8-mole ethylene oxide adduct of straight-chain primary alcohol, with the number of carbon atoms of 12)

Polyoxyethylene lauryl ether (EMULGEN 109P (from KAO Corporation), 9-mole ethylene oxide adduct of straight-chain primary alcohol, with the number of carbon atoms of 12)

Polyoxyethylene lauryl ether (EMULGEN 120 (from KAO Corporation), 12-mole ethylene oxide adduct of straight-chain primary alcohol, with the number of carbon atoms of 12)

Polyoxyethylene lauryl ether (EMULGEN 150 (from KAO Corporation), 47-mole ethylene oxide adduct of straight-chain primary alcohol, with the number of carbon atoms of 12)

Polyoxyethylene cetyl ether (EMULGEN 220 (from KAO Corporation), 13-mole ethylene oxide adduct of straight-chain primary alcohol, with the number of carbon atoms of 16)

Polyoxyethylene stearyl ether (EMULGEN 320P (from KAO Corporation), 13-mole ethylene oxide adduct of straight-chain primary alcohol, with the number of carbon atoms of 18)

Polyoxyethylene behenyl ether (BLAUNON BE-16 (from AOKI OIL INDUSTRIAL Co., Ltd.), 16-mole ethylene oxide adduct of straight-chain primary alcohol, with the number of carbon atoms of 22)

Polyethylene glycol monolaurate (EMANON 1112 (from KAO Corporation), polyethylene glycol (n=9) monolauryl (the number of carbon atoms=12) ester)

Polyethylene glycol monooleate (BLAUNON 0-600SA (from AOKI OIL INDUSTRIAL Co., Ltd.), polyethylene glycol (n=14) monooleyl (the number of carbon atoms=18) ester) (b) anionic surfactant Potassium oleate (NONSAL ON-1N (from NOF Corporation))

Sodium laurate (NONSAL LK-2 (from NOF Corporation)) Sodium dodecylbenzene sulfonate (NEOPELEX G-15 (from KAO Corporation))

Sodium lauryl sulfate (EMAL 2FG (from KAO Corporation))

Development Accelerator

Diethylene glycol dibutyl ether (diethylene glycol dibutyl ether (from Tokyo Chemical Industry Co., Ltd.))

pH Adjustor

Sodium carbonate (sodium carbonate from Tokyo Chemical Industry Co., Ltd.)

Sodium hydroxide (sodium hydroxide from Tokyo Chemical Industry Co., Ltd.)

The obtained aqueous developer and the photosensitive flexographic printing original plate were evaluated according to the methods below. Results of Examples 1 to 16 were summarized in Table 1, and those of Comparative Examples 1 to 10 were summarized in Table 2.

<Evaluation Method>

Definition of the individual characteristics and measurement of the individual characteristic values in Examples and Comparative Examples are as follows.

(1) Brushing Friction Coefficient

A machine-bristled flat brush was manufactured by using a 170 μm diameter nylon filament as a bristle material, and a vinyl chloride plate of 10 mm thick, 140 mm long and 70 mm wide as a base. Specification of the flat brush include a hole diameter of 2.5 mm, a hole pitch of 6×6 mm, staggered bristling, and a bristle length of 17 mm. Sliding test was conducted with use of the flat brush, according to a test method illustrated in FIG. 1. First, a sliding block was manufactured with use of a 30×50 mm SUS 304 metal plate having a thickness of 12 mm. Next, a photosensitive flexographic printing original plate having the same size with the sliding block was prepared, and then bonded to the sliding block with a double-sided tape, so as to bring the support side of the flexographic printing original plate into contact with the sliding block. The protective film was removed from the photosensitive flexographic printing original plate, and the infrared-sensitive layer and the protective layer were peeled off with use of sellotape (registered trademark), thereby exposing the photosensitive resin layer. The brush was then fixed to the bottom of a stainless steel tray with use of a double-sided tape. Next, the aqueous developer was filled in the stainless steel tray so that the end of bristle of the brush became 1 to 2 mm below the liquid level. The sliding block having the printing original plate bonded thereto was then arranged on the bristle of the brush, so as to bring the surface of the photosensitive resin layer of the printing original plate into contact with the end of brush bristle. Quantity of the aqueous developer was then further adjusted to thoroughly immerse the brush, and the sliding block having the photosensitive flexographic printing original plate attached thereto, and the state of immersion was kept still for 60 minutes. Sixty minutes after the start of immersion, the sliding block was moved with a thread for evaluation of slidability. Measurement conditions include a tensile speed of 500 mm/min, a weight of the sliding block (total mass of the metal plate and the flexographic printing original plate, before immersed in the aqueous developer) of 82 g, a footprint of brush of 30×50 mm. The thread for causing movement was PE line, IZANAS Thread No. 1, from YGK YOZ-AMI Co., Ltd. A reason of choice is that the thread necessarily exhibits high compliance with the radius of curvature of a pulley, and a sufficiently large tensile elasticity. Position of the pulley was adjusted so that the thread is tensed horizontally between the sliding block and the pulley. A start point of sliding was set to 20 mm horizontally away from the pulley. Assuming the start point of sliding as the origin at 0 mm, four-point average load was determined from the load measured at 20, 25, 30 and 35 mm points, and the averaged load further averaged from ten samples (n=10) was determined as frictional force [mN]. The frictional force of the sliding block was substituted in the equation below, to evaluate the brushing friction coefficient.

Brushing friction coefficient [−]=Frictional force [mN]÷Weight of sliding block [g]÷Gravitational constant [m/s$^2$]

(2) The Development Speed

The protective film was removed from a 100×100 mm photosensitive flexographic printing original plate having a thickness of 1.7 mm, and the protective layer and the infrared-sensitive layer were peeled off with use of sellotape (registered trademark), thereby exposing the photosensitive resin layer. Two types of flat brushes with different brush diameters were manufactured as the development brush, which are a 170 μm diameter standard brush and a 132 μm diameter thin brush. Specification of the flat brushes include a hole diameter of 2.5 mm, a hole pitch of 6×6 mm, staggered bristling, and a bristle length of 17 mm. Each printing original plate was then developed in the aqueous developer, by using a development apparatus for photosensitive resin plate equipped with each of thus manufactured brushes. Thickness of the photosensitive resin original plate was measured at the center, before development, and after 2-minute, 4-minute, 6-minute and 8-minute developments. Amount of change of the thickness, when compared with the thickness before development, was defined as depth of development [mm]. The development time [min] was plotted on the abscissa, the depth of development [mm] was plotted on the ordinate, and the slope of the graph was determined by the least squares method. The slope was defined as the development speed [mm/min].

(3) Pattern Reproducibility (Thin Lines)

The photosensitive flexographic printing original plate was subjected to back exposure, main exposure, development, drying and post-exposure, according to the procedures below, so as to obtain the printing plate.

Back exposure: A 200×150 mm photosensitive flexographic printing original plate with a thickness of 1.7 mm was used. The photosensitive flexographic printing original plate was irradiated with ultraviolet radiation from the side of the multilayered film Y, with use of 10R40W from PHILIPS N.V. Ultraviolet light quantity was set to 150 mJ/cm$^2$. The light quantity was measured by using an ultraviolet irradiance meter UV-M03A, which is a main unit attached with a photodetector UV-SN35-M10 for the ultraviolet irradiance meter. The same method will apply to measurement of light quantity described hereinbelow, unless otherwise specifically noted.

Laser drawing: After peeling off the protective layer, a graphic pattern was drawn with an infrared laser into the infrared-sensitive layer. An infrared laser apparatus used here was ESKO CDI Spark 4835. Laser illuminance was set to 2.7 J/cm$^2$, and resolution was set to 4000 dpi. A graphic pattern used here was the one illustrated in FIG. 2.

Main exposure: Irradiation of ultraviolet radiation was conducted from the side of infrared-sensitive layer having the graphic pattern drawn therein, by using the apparatus same as that used for the back exposure. Ultraviolet light quantity was set to 3800 mJ/cm$^2$.

Development: The photosensitive flexographic printing original plate was loaded on the development apparatus same as that used for evaluating the development speed, and developed with the aqueous developer. Time at which the depth of development reaches 0.7 mm was calculated from the development speed, and the obtained value was used as the development time.

Drying: The plate was dried in a hot air dryer at 60° C. for 10 minutes.

Post exposure: Irradiation of ultraviolet radiation was conducted from the side where the graphic pattern resides, by using the apparatus same as that used for the back exposure. Ultraviolet light quantity was set to 3800 mJ/cm$^2$.

Pattern reproducibility: The obtained printing plate was observed under a microscope. Any part causing skew, collapse or chip in the pattern was judged as failed in reproduction, and the other part was judged as succeeded in reproduction. Width of thin lines was varied among 10, 15, 20, 25, 30, 35 and 40 µm, and the thinnest line width successfully reproduced was employed as an evaluation result.

(4) Dispersibility Un-Photocrosslinked Resin Component

The protective film was removed from the photosensitive flexographic printing original plate, and the protective layer and the infrared-sensitive layer were peeled off with use of sellotape (registered trademark), thereby exposing the photosensitive resin layer. The aqueous developer was filled in the developing apparatus same as that used for evaluating the development speed. The photosensitive resin layer of the printing original plate was rubbed with the brush to thereby make the photosensitive resin dispersed into the aqueous developer, while adjusting the amount of dispersion of the photosensitive resin to 10% by mass relative to the developer. The developer containing 10% by mass of photosensitive resin was stirred thoroughly. Then, a 50×100 mm PET film strip having a thickness of 100 µm was dipped into the developer and then taken out. The PET film was then placed on a black felt, and size of photosensitive resin particle adhered thereon was observed under a microscope (VHX-5000, from KEYENCE Corporation, with 20× objective lens ZS-20). Within a microscopic field of view, twelve photosensitive resin particles of the largest levels were measured for their size. The largest and second largest measured values were excluded, and the residual ten values were averaged to determine a result of evaluation.

(5) Dispersibility of Pattern Mask Layer (Infrared-Sensitive Layer)

Twenty-five 7 cm×7 cm photosensitive flexographic printing original plates were immersed one by one in 100 ml of the aqueous developer for 30 seconds while applying vibration, and then lightly rubbed with a finger to fall off the pattern mask layer from the original plate.

Size of the thus dispersed small flakes of the pattern mask layer were visually evaluated. Twelve small flakes, visually judged to be large, were measured for their size. The largest and second largest measured values were excluded, and the residual ten values were averaged to determine a result of evaluation.

TABLE 1

| | | Compounds | Number of carbon atoms of the alkyl group | HLB value | 1 | 2 | 3 | 4 | 5 | 6 | 7 | 8 |
|---|---|---|---|---|---|---|---|---|---|---|---|---|
| Chemical composition of the developer composition (parts by mass) | (a) Nonionic surfactant | Polyethylene glycol monohexylate | 6 | 14 | | | | | | | | |
| | | Polyoxyethylene 2-ethylhexyl ether | 8 | 13 | | | | | | | | |
| | | Polyoxyethylene decyl ether | 10 | 14 | | | | | | | | |
| | | Polyoxyethylene lauryl ether | 12 | 10 | | | | | | | | |
| | | Polyoxyethylene lauryl ether | 12 | 12 | | | | 50 | | | | |
| | | Polyoxyethylene lauryl ether | 12 | 13 | | 50 | | | | | | |
| | | Polyoxyethylene lauryl ether | 12 | 14 | 50 | | | | | | | |
| | | Polyoxyethylene lauryl ether | 12 | 15 | | | | | 50 | 50 | 50 | 50 |
| | | Polyoxyethylene lauryl ether | 12 | 18 | | | | | | | | |
| | | Polyoxyethylene cetyl ether | 16 | 14 | | | | | | | | 50 |
| | | Polyoxyethylene stearyl ether | 18 | 14 | | | | | | | | |
| | | Polyoxyethylene behenyl ether | 22 | 14 | | | | | | | | |

TABLE 1-continued

| | | Compounds | Number of carbon atoms of the alkyl group | HLB value | Ex 1 | Ex 2 | Ex 3 | Ex 4 | Ex 5 | Ex 6 | Ex 7 | Ex 8 |
|---|---|---|---|---|---|---|---|---|---|---|---|---|
| | | Polyethylene glycol monolaurate | 12 | 14 | | | | | | | | |
| | | Polyethylene glycol monooleate | 18 | 14 | | | | | | | | |
| | (b) Anionic surfactant | Potassium oleate | | | 50 | 50 | 50 | 50 | | | | 50 |
| | | Sodium laurate | | | | | | | 50 | | | |
| | | Sodium dodecylbenzene sulfonate | | | | | | | | 50 | | |
| | | Sodium lauryl sulfate | | | | | | | | | 50 | |
| | Development accelerator | Diethylene glycol dibutyl ether | | | | | | | | | | |
| | pH adjustor | Sodium carbonate | | | | | | | | | | |
| | | Sodium hydroxide | | | | | | | | | | |
| Evaluation results | | Brushing friction coefficient | [—] | | 0.65 | 0.67 | 0.68 | 0.63 | 0.62 | 0.64 | 0.65 | 0.70 |
| | | Development speed 132 μm diameter nylon brush | [mm/min.] | | 0.15 | 0.15 | 0.15 | 0.14 | 0.14 | 0.14 | 0.12 | 0.13 |
| | | 170 μm diameter nylon brush | [mm/min.] | | 0.16 | 0.15 | 0.15 | 0.15 | 0.15 | 0.15 | 0.13 | 0.13 |
| | | Pattern reproducibility (thin lines) | [μm] | | 10 | 10 | 15 | 10 | 10 | 10 | 10 | 10 |
| | | Dispersibility of un-photocrosslinked resin component | [mm] | | 0.05 | 0.06 | 0.06 | 0.06 | 0.06 | 0.06 | 0.06 | 0.05 |
| | | Dispersibility of pattern mask layer | [mm] | | 1.8 | 2.1 | 2.4 | 1.6 | 1.2 | 0.8 | 1.9 | 1.8 |

| | | Compounds | Number of carbon atoms of the alkyl group | HLB value | Ex 9 | Ex 10 | Ex 11 | Ex 12 | Ex 13 | Ex 14 | Ex 15 | Ex 16 |
|---|---|---|---|---|---|---|---|---|---|---|---|---|
| Chemical composition of the developer composition (parts by mass) | (a) Nonionic surfactant | Polyethylene glycol monohexylate | 6 | 14 | | | | | | | | |
| | | Polyoxyethylene 2-ethylhexyl ether | 8 | 13 | | | | | | 50 | | |
| | | Polyoxyethylene decyl ether | 10 | 14 | | | | | | | 50 | |
| | | Polyoxyethylene lauryl ether | 12 | 10 | | | | | | | | |
| | | Polyoxyethylene lauryl ether | 12 | 12 | | | | | | | | |
| | | Polyoxyethylene lauryl ether | 12 | 13 | | 30 | 70 | | | | | |
| | | Polyoxyethylene lauryl ether | 12 | 14 | | | | | | | | |
| | | Polyoxyethylene lauryl ether | 12 | 15 | | | | | 70 | | | |
| | | Polyoxyethylene lauryl ether | 12 | 18 | | | | | | | | |
| | | Polyoxyethylene cetyl ether | 16 | 14 | | | | | | | | |
| | | Polyoxyethylene stearyl ether | 18 | 14 | 50 | | | | | | | |
| | | Polyoxyethylene behenyl ether | 22 | 14 | | | | | | | | |
| | | Polyethylene glycol monolaurate | 12 | 14 | | | | | | | 50 | |
| | | Polyethylene glycol monooleate | 18 | 14 | | | | | | | | 50 |
| | (b) Anionic surfactant | Potassium oleate | | | 50 | 70 | 30 | | 50 | 50 | 50 | 50 |
| | | Sodium laurate | | | | | | | | | | |
| | | Sodium dodecylbenzene sulfonate | | | | | | | | | | |
| | | Sodium lauryl sulfate | | | | | | 30 | | | | |
| | Development accelerator | Diethylene glycol dibutyl ether | | | | | | | | | | |
| | pH adjustor | Sodium carbonate | | | | | | | | | | |
| | | Sodium hydroxide | | | | | | | | | | |
| Evaluation results | | Brushing friction coefficient | [—] | | 0.72 | 0.62 | 0.74 | 0.72 | 0.65 | 0.68 | 0.66 | 0.72 |
| | | Development speed 132 μm diameter nylon brush | [mm/min.] | | 0.13 | 0.13 | 0.17 | 0.16 | 0.15 | 0.15 | 0.15 | 0.13 |
| | | 170 μm diameter nylon brush | [mm/min.] | | 0.13 | 0.13 | 0.17 | 0.16 | 0.16 | 0.16 | 0.15 | 0.13 |
| | | Pattern reproducibility (thin lines) | [μm] | | 10 | 10 | 20 | 15 | 15 | 15 | 10 | 10 |
| | | Dispersibility of un-photocrosslinked resin component | [mm] | | 0.04 | 0.05 | 0.05 | 0.06 | 0.05 | 0.05 | 0.05 | 0.05 |
| | | Dispersibility of pattern mask layer | [mm] | | 1.7 | 0.9 | 2.5 | 2.7 | 2.6 | 2.2 | 2.4 | 1.8 |

TABLE 2

| | | Compounds | Number of carbon atoms of the alkyl group | HLB value | Comp. Ex 1 | Comp. Ex 2 | Comp. Ex 3 | Comp. Ex 4 | Comp. Ex 5 | Comp. Ex 6 |
|---|---|---|---|---|---|---|---|---|---|---|
| Chemical composition of the developer composition (parts by mass) | (a) Nonionic surfactant | Polyethylene glycol monohexylate | 6 | 14 | | | 50 | | | |
| | | Polyoxyethylene 2-ethylhexyl ether | 8 | 13 | | | | | | |
| | | Polyoxyethylene decyl ether | 10 | 14 | | | | | | |
| | | Polyoxyethylene lauryl ether | 12 | 10 | 50 | | | | | |
| | | Polyoxyethylene lauryl ether | 12 | 12 | | | | | | 100 |
| | | Polyoxyethylene lauryl ether | 12 | 13 | | | | 20 | 80 | |
| | | Polyoxyethylene lauryl ether | 12 | 14 | | | | | | |
| | | Polyoxyethylene lauryl ether | 12 | 15 | | | | | | |
| | | Polyoxyethylene lauryl ether | 12 | 18 | | 50 | | | | |
| | | Polyoxyethylene cetyl ether | 16 | 14 | | | | | | |

TABLE 2-continued

| | | Compounds | | | | | | | |
|---|---|---|---|---|---|---|---|---|---|
| | | Polyoxyethylene stearyl ether | 18 | 14 | | | | | |
| | | Polyoxyethylene behenyl ether | 22 | 14 | | | | | |
| | | Polyethylene glycol monolaurate | 12 | 14 | | | | | |
| | | Polyethylene glycol monooleate | 18 | 14 | | | | | |
| | (b) Anionic surfactant | Potassium oleate | | | 50 | 50 | 50 | 80 | 20 |
| | | Sodium laurate | | | | | | | |
| | | Sodium dodecylbenzene sulfonate | | | | | | | |
| | | Sodium lauryl sulfate | | | | | | | |
| | Development accelerator | Diethylene glycol dibutyl ether | | | | | | | |
| | pH adjustor | Sodium carbonate | | | | | | | |
| | | Sodium hydroxide | | | | | | | |
| Evaluation results | | Brushing friction coefficient | [—] | | 0.69 | 0.55 | 0.64 | 0.52 | 0.76 | 0.77 |
| | | Development speed 132 μm diameter nylon brush | [mm/min.] | | 0.13 | 0.09 | 0.15 | 0.09 | 0.15 | 0.13 |
| | | 170 μm diameter nylon brush | [mm/min.] | | 0.13 | 0.09 | 0.16 | 0.11 | 0.15 | 0.15 |
| | | Pattern reproducibility (thin lines) | [μm] | | 30 | 10 | 30 | 10 | 30 | 35 |
| | | Dispersibility of un-photocrosslinked resin component | [mm] | | 0.18 | 0.05 | 0.19 | 0.05 | 0.05 | 0.06 |
| | | Dispersibility of pattern mask layer | [mm] | | 2.2 | 1.6 | 3.2 | 0.8 | 4.5 | 5.5 |

| | | Compounds | Number of carbon atoms of the alkyl group | HLB value | Comparative Examples 7 | 8 | 9 | 10 |
|---|---|---|---|---|---|---|---|---|
| Chemical composition of the developer composition (parts by mass) | (a) Nonionic surfactant | Polyethylene glycol monohexylate | 6 | 14 | | | | |
| | | Polyoxyethylene 2-ethylhexyl ether | 8 | 13 | | | | |
| | | Polyoxyethylene decyl ether | 10 | 14 | | | | |
| | | Polyoxyethylene lauryl ether | 12 | 10 | | | | |
| | | Polyoxyethylene lauryl ether | 12 | 12 | | | | |
| | | Polyoxyethylene lauryl ether | 12 | 13 | | | | |
| | | Polyoxyethylene lauryl ether | 12 | 14 | | | | |
| | | Polyoxyethylene lauryl ether | 12 | 15 | | | 60 | |
| | | Polyoxyethylene lauryl ether | 12 | 18 | | | | |
| | | Polyoxyethylene cetyl ether | 16 | 14 | | | | |
| | | Polyoxyethylene stearyl ether | 18 | 14 | | | | |
| | | Polyoxyethylene behenyl ether | 22 | 14 | | | | 50 |
| | | Polyethylene glycol monolaurate | 12 | 14 | | | | |
| | | Polyethylene glycol monooleate | 18 | 14 | | | | |
| | (b) Anionic surfactant | Potassium oleate | | | 100 | 50 | | 50 |
| | | Sodium laurate | | | | 50 | | |
| | | Sodium dodecylbenzene sulfonate | | | | | | |
| | | Sodium lauryl sulfate | | | | | | |
| | Development accelerator | Diethylene glycol dibutyl ether | | | | | | 30 |
| | pH adjustor | Sodium carbonate | | | | | | 10 |
| | | Sodium hydroxide | | | | | | |
| Evaluation results | | Brushing friction coefficient | [—] | | 0.51 | 0.50 | 0.65 | Evaluation abandoned |
| | | Development speed 132 μm diameter nylon brush | [mm/min.] | | 0.08 | 0.08 | 0.13 | |
| | | 170 μm diameter nylon brush | [mm/min.] | | 0.10 | 0.10 | 0.15 | |
| | | Pattern reproducibility (thin lines) | [μm] | | 10 | 10 | 40 | |
| | | Dispersibility of un-photocrosslinked resin component | [mm] | | 0.05 | 0.05 | 0.07 | |
| | | Dispersibility of pattern mask layer | [mm] | | 1.2 | 0.6 | 3.6 | |

As is clear from Table 1, Examples 1 to 16 that satisfy all of the requirements of the present invention were found to yield the products that exhibit satisfactory levels of performance for all items of evaluation.

In contrast, Comparative Examples 1 to 10 were found to fail in achieving satisfactory result regarding one or more items of evaluation. More specifically, Comparative Example 1, in which the HLB value of the (a) nonionic surfactant was too small, was found to result in poor levels of pattern reproducibility, and dispersibility of the un-crosslinked photosensitive resin component. Comparative Example 2, in which the HLB value of the (a) nonionic surfactant was too large, was found to result in too small brushing friction coefficient, and inferior in development speed. Comparative Example 3, in which the number of carbon atoms of the alkyl group in the (a) nonionic surfactant was too small, was found to be inferior in pattern reproducibility, dispersibility of the un-photocrosslinked photosensitive resin component, and dispersibility of the pattern mask layer. Comparative Example 4, in which the ratio of blending of the (a) nonionic surfactant was too small, was found to result in too small brushing friction coefficient, and inferior in development speed. Comparative Example 5, in which the ratio of blending of the (a) nonionic surfactant was too large, was found to result in too large brushing friction coefficient, poor pattern reproducibility, and poor dispersibility of the pattern mask layer. Comparative Example 6, in which the (b) anionic surfactant is not blended at all, was found to result in too large brushing friction coefficient, poor pattern reproducibility, and poor dispersibility of the pattern mask layer. Comparative Example 7 and 8, in which the (a) nonionic surfactant was not blended at all, were found to result in too small brushing friction coefficient, and poor development speed. Note that Comparative Example 10, in which the number of carbon atoms of the alkyl group in the (a) nonionic surfactant was too large, was failed in obtaining a homogeneous aqueous developer, since the (a) nonionic surfactant in the developer composition could not be completely dissolved in tap water during the process of preparing the developer, whereby the evaluation was abandoned.

Comparative Example 9, in which a development accelerator such as diethylene glycol dibutyl ether was blended as disclosed in Patent Document 3, was found to be inferior in pattern reproducibility due to swelling of the photocrosslinked photosensitive resin that forms the pattern-forming part of the printing plate, and also inferior in dispersibility of the pattern mask layer.

INDUSTRIAL APPLICABILITY

According to the developer composition of the present invention, it is possible to satisfy high development speed even with a thin brush, and satisfy high levels of pattern reproducibility, diespersibility of the un-photocrosslinked resin composition in the photosensitive resin layer, and dispersibility of the pattern mask layer, all of which have been issues from the past. Therefore, the present invention is very useful.

The invention claimed is:

1. A method for manufacturing a flexographic printing plate, comprising a step of developing a CTP flexographic printing original plate with use of an aqueous developer, wherein the CTP flexographic printing original plate has at least (A) a support, (B) a photosensitive resin layer, (C) a protective layer, and (D) an infrared-sensitive layer that contains carbon black, which are stacked in this order, and wherein the aqueous developer comprises 90 to 99.9% by mass of water and 0.1 to 10% by mass of a developer composition containing (a) a nonionic surfactant, the nonionic surfactant consisting of monoalkyl ether and/or monoalkyl ester of polyethylene glycol, wherein a number of carbon atoms of the alkyl group therein is 8 to 19, and wherein an HLB value thereof is 11 to 15; and (b) one or more anionic surfactants selected from the group consisting of oleic acid metal salt, lauric acid metal salt, dodecylbenzene sulfonic acid metal salt and lauryl sulfate metal salt, wherein a content ratio of (a):(b) is 25:75 to 75:25 (mass ratio), and wherein a brushing friction coefficient on a surface of a printing original plate is 0.60 to 0.75[−], when measured in an aqueous developer containing 1% by mass of the developer composition and 99% by mass of water.

2. A method for manufacturing a flexographic printing plate, comprising a step of developing a flexographic printing original plate with use of an aqueous developer, wherein the flexographic printing original plate has at least (A) a support, (B) a photosensitive resin layer, and (E) an anti-sticking layer, which are stacked in this order, and wherein the aqueous developer comprises 90 to 99.9% by mass of water and 0.1 to 10% by mass of a developer composition containing (a) a nonionic surfactant, the nonionic surfactant consisting of monoalkyl ether and/or monoalkyl ester of polyethylene glycol, wherein a number of carbon atoms of the alkyl group therein is 8 to 19, and wherein an HLB value thereof is 11 to 15; and (b) one or more anionic surfactants selected from the group consisting of oleic acid metal salt, lauric acid metal salt, dodecylbenzene sulfonic acid metal salt and lauryl sulfate metal salt, wherein a content ratio of (a):(b) is 25:75 to 75:25 (mass ratio), and wherein a brushing friction coefficient on a surface of a printing original plate is 0.60 to 0.75[−], when measured in an aqueous developer containing 1% by mass of the developer composition and 99% by mass of water.

3. A method for manufacturing an flexographic printing plate according to claim 1, wherein the (a) nonionic surfactant is one or more compounds selected from the group consisting of polyoxyethylene 2-ethylhexyl ether, polyoxyethylene isodecyl ether, polyoxyethylene lauryl ether, polyoxyethylene cetyl ether, polyoxyethylene stearyl ether, polyethylene glycol monocaprylate, polyethylene glycol monocaprate, polyethylene glycol monolaurate, polyethylene glycol monomyristate, polyethylene glycol monostearate, polyethylene glycol monooleate and polyoxyethylene monostearate.

4. A method for manufacturing an flexographic printing plate according to claim 2, wherein the (a) nonionic surfactant is one or more compounds selected from the group consisting of polyoxyethylene 2-ethylhexyl ether, polyoxyethylene isodecyl ether, polyoxyethylene lauryl ether, polyoxyethylene cetyl ether, polyoxyethylene stearyl ether, polyethylene glycol monocaprylate, polyethylene glycol monocaprate, polyethylene glycol monolaurate, polyethylene glycol monomyristate, polyethylene glycol monostearate, polyethylene glycol monooleate and polyoxyethylene monostearate.

* * * * *